United States Patent
Song

(10) Patent No.: US 12,082,417 B2
(45) Date of Patent: Sep. 3, 2024

(54) 3-DIMENSIONAL FLASH MEMORY HAVING AIR GAP, AND METHOD FOR MANUFACTURING SAME

(71) Applicant: Samsung Electronics Co., Ltd., Suwon-si (KR)

(72) Inventor: Yun Heub Song, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 420 days.

(21) Appl. No.: 17/424,255

(22) PCT Filed: Jan. 23, 2020

(86) PCT No.: PCT/KR2020/001219
§ 371 (c)(1),
(2) Date: Jul. 20, 2021

(87) PCT Pub. No.: WO2020/153813
PCT Pub. Date: Jul. 30, 2020

(65) Prior Publication Data
US 2022/0115398 A1    Apr. 14, 2022

(30) Foreign Application Priority Data
Jan. 25, 2019 (KR) .................. 10-2019-0009650

(51) Int. Cl.
*H10B 43/27* (2023.01)
*H01L 29/06* (2006.01)
(Continued)

(52) U.S. Cl.
CPC ......... *H10B 43/27* (2023.02); *H01L 29/0649* (2013.01); *H10B 41/27* (2023.02); *H10B 41/30* (2023.02); *H10B 43/30* (2023.02)

(58) Field of Classification Search
CPC ............................ H10B 43/27; H01L 29/4234
See application file for complete search history.

(56) References Cited

U.S. PATENT DOCUMENTS

| 8,625,367 | B2 | 1/2014 | Yun et al. |
| 8,653,585 | B2 | 2/2014 | Youm et al. |

(Continued)

FOREIGN PATENT DOCUMENTS

| KR | 1020110128717 A | 11/2011 |
| KR | 1020120003169 A | 1/2012 |

(Continued)

OTHER PUBLICATIONS

KR Notice of Allowance dated Jul. 13, 2020 issued in corresponding KR Application No. 10-2019-000965.

(Continued)

*Primary Examiner* — Alia Sabur
(74) *Attorney, Agent, or Firm* — Muir Patent Law, PLLC

(57) ABSTRACT

A 3-dimensional (3D) flash memory having a structure that mitigates an interference phenomenon between neighboring cells in an oxide-nitride-oxide (ONO) layer, which is a charge storage layer, and a method of manufacturing the same are provided. The 3D flash memory includes at least one channel layer formed to extend in a first direction; a plurality of electrode layers formed to extend in a second direction orthogonal to a first direction so as to be vertically stacked with respect to the at least one channel layer; a plurality of air gaps interposed between the plurality of electrode layers to separate the plurality of electrode layers from each other; and at least one oxide-nitride-oxide (ONO) layer comprising a first oxide layer, a nitride layer, and a second oxide layer and formed to extend in the first direction to connect the at least one channel layer and the plurality of electrode layers, wherein the 3D flash memory includes a structure that mitigates an interference phenomenon between cells respectively contacting the plurality of electrode layers in the at least one ONO layer.

2 Claims, 15 Drawing Sheets

(51) Int. Cl.
*H10B 41/27* (2023.01)
*H10B 41/30* (2023.01)
*H10B 43/30* (2023.01)

(56) References Cited

U.S. PATENT DOCUMENTS

| | | | |
|---|---|---|---|
| 9,847,346 B2 | 12/2017 | Lee et al. | |
| 2010/0140685 A1* | 6/2010 | Kang | H10B 43/27 |
| | | | 438/129 |
| 2012/0001264 A1 | 1/2012 | Kim et al. | |
| 2013/0119531 A1* | 5/2013 | Tanaka | H01L 21/02304 |
| | | | 257/734 |
| 2013/0334585 A1* | 12/2013 | Lee | H01L 29/66833 |
| | | | 438/257 |
| 2014/0138760 A1 | 5/2014 | Makala et al. | |
| 2014/0310448 A1 | 10/2014 | Nam et al. | |
| 2015/0008505 A1* | 1/2015 | Chien | H10B 41/20 |
| | | | 257/324 |
| 2015/0132915 A1* | 5/2015 | Park | H01L 29/7789 |
| | | | 438/287 |
| 2016/0020225 A1 | 1/2016 | Sakamoto et al. | |
| 2016/0268299 A1* | 9/2016 | Masuda | H10B 43/27 |

FOREIGN PATENT DOCUMENTS

| | | |
|---|---|---|
| KR | 1020120103044 A | 9/2012 |
| KR | 1020120130588 A | 12/2012 |
| KR | 1020170036878 A | 4/2017 |
| KR | 1020180101834 A | 9/2018 |

OTHER PUBLICATIONS

KR Office Action dated Dec. 19, 2019 issued in corresponding KR Application No. 10-2019-0009650.

* cited by examiner

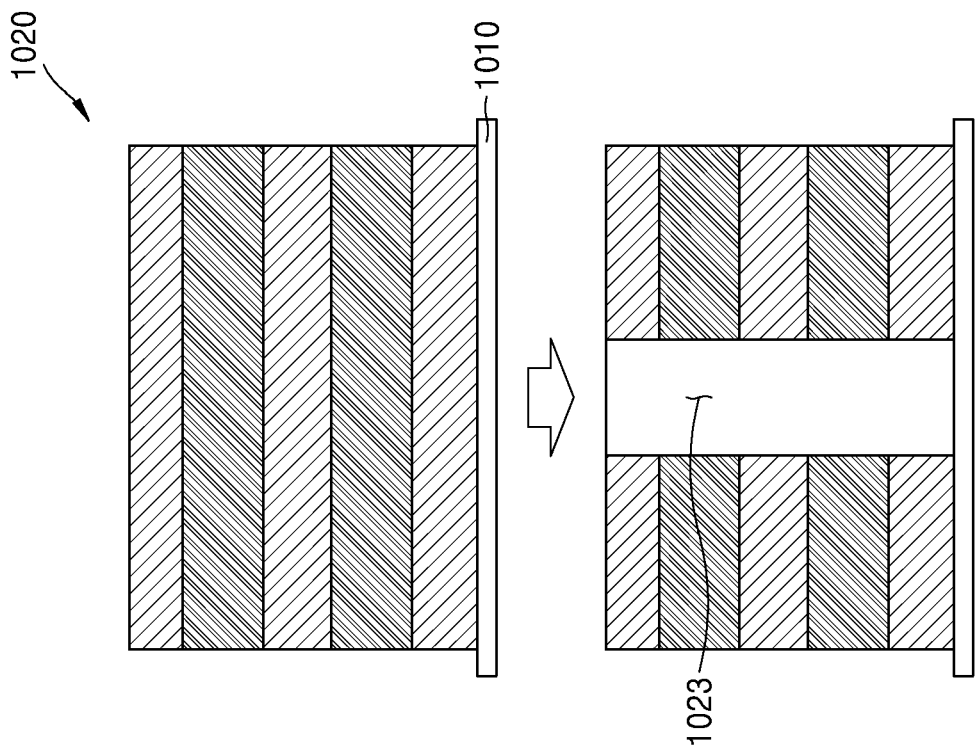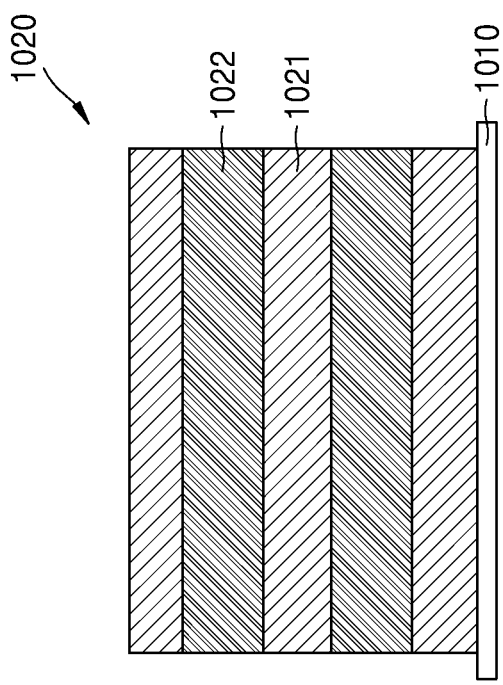

3-DIMENSIONAL FLASH MEMORY HAVING AIR GAP, AND METHOD FOR MANUFACTURING SAME

TECHNICAL FIELD

The embodiments relate to a 3-dimensional (3D) flash memory and a method of manufacturing the same, and more particularly, to a technology for improving the vertical scaling of a 3D flash memory.

BACKGROUND ART

A flash memory device is an electrically erasable programmable read only memory (EEPROM) and may be commonly used in, for example, a computer, a digital camera, an MP3 player, a game system, a memory stick, etc. The flash memory device electrically controls data input/output by Fowler-Nordheim tunneling or hot electron injection.

Specifically, referring to FIG. 1 showing an array of a 3D flash memory of the related art, the array of the 3D flash memory may include a common source line CSL, a bit line BL, and a plurality of cell strings CSTR disposed between the common source line CSL and the bit line BL.

Bit lines are arranged two-dimensionally, and the plurality of cell strings CSTR are connected in parallel to each of the bit lines. The cell strings CSTR may be commonly connected to the common source line CSL. That is, the plurality of cell strings CSTR may be disposed between the plurality of bit lines and one common source line CSL. In this regard, there may be a plurality of common source lines CSL, and the plurality of common source lines CSL may be two-dimensionally arranged. In this case, the same voltage may be electrically applied to the plurality of common source lines CSL, or each of the plurality of common source lines CSL may be electrically controlled.

Each of the cell strings CSTR may include a ground selection transistor GST connected to the common source line CSL, a string selection transistor SST connected to the bit line BL, and a plurality of memory cell transistors MCT disposed between ground and the string selection transistors GST and SST. In addition, the ground selection transistor GST, the string selection transistor SST, and the memory cell transistors MCT may be connected in series.

The common source line CSL may be commonly connected to sources of the ground selection transistors GST. In addition, the ground selection line GSL disposed between the common source line CSL and the bit line BL, a plurality of word lines WL0-WL3, and a plurality of string selection lines SSL may be used as electrode layers of the ground selection transistor GST, the memory cell transistors MCT, and the string select transistors SST, respectively. In addition, each of the memory cell transistors MCT includes a memory element.

The 3D flash memory of the related art is increasing a degree of integration as cells are vertically stacked and thus excellent performance and low price as required by consumers are achieved.

For example, referring to FIG. 2 showing the structure of a 3D flash memory of the related art, the 3D flash memory may be manufactured to include an electrode structure 215 in which interlayer insulating layers 211 and horizontal structures 250 are alternately repeatedly formed on a substrate 200. The interlayer insulating layers 211 and the horizontal structures 250 may extend in a first direction. The interlayer insulating layers 211 may be, for example, silicon oxide layers, and a lowermost interlayer insulating layer 211a of the interlayer insulating layers 211 may have a thickness less than that of the remaining interlayer insulating layers 211. Each of the horizontal structures 250 may include first and second blocking insulating layers 242 and 243 and an electrode layer 245. A plurality of electrode structures 215 may be provided, and the plurality of electrode structures 215 may be disposed facing each other in a second direction crossing the first direction. The first and second directions may correspond to the x-axis and y-axis of FIG. 2, respectively. Trenches 240 may extend between the plurality of electrode structures 215 in the first direction to separate the plurality of electrode structures 215 from each other. Impurity regions doped with a high concentration may be formed so that a common source line CSL may be formed in the substrate 200 exposed by the trenches 240. Although not shown, isolation insulating layers filled in the trenches 240 may be further disposed.

Vertical structures 230 passing through the electrode structure 215 may be disposed. For example, the vertical structures 230 may be arranged in a matrix form by being aligned along the first and second directions in a plan view. As another example, the vertical structures 230 may be aligned in the second direction while being arranged in a zigzag shape in the first direction. Each of the vertical structures 230 may include a protective layer 224, a charge storage layer 225, a tunnel insulating layer 226, and a channel layer 227. For example, the channel layer 227 may be disposed in a hollow tube shape, and in this case, a buried layer 228 filled inside the channel layer 227 may be further disposed. A drain region D may be disposed on the channel layer 227 and a conductive pattern 229 may be formed on the drain region D to be connected to the bit line BL. The bit line BL may extend in a direction crossing the horizontal electrodes 250, for example, in the second direction. For example, the vertical structures 230 aligned in the second direction may be connected to one bit line BL.

The first and second blocking insulating layers 242 and 243 included in the horizontal structures 250 and the charge storage layer 225 and the tunnel insulating layer 226 included in the vertical structures 230 may be defined as an oxide-nitride-oxide (ONO) layer, which is an information storage element. That is, some of information storage elements may be included in the vertical structures 230, and the remaining ones may be included in the horizontal structures 250. For example, from among the information storage elements, the charge storage layer 225 and the tunnel insulating layer 226 may be included in the vertical structures 230, and the first and second blocking insulating layers 242 and 243 may be included in the horizontal structures 250.

Epitaxial patterns 222 may be disposed between the substrate 200 and the vertical structures 230. The epitaxial patterns 222 connect the substrate 200 and the vertical structures 230. The epitaxial patterns 222 may contact the horizontal structures 250 of at least one layer. That is, the epitaxial patterns 222 may be disposed to contact the lowermost horizontal structure 250a. According to another embodiment, the epitaxial patterns 222 may be arranged to contact the horizontal structures 250 of a plurality of layers, for example, two layers. When the epitaxial patterns 222 are disposed to contact the lowermost horizontal structure 250a, the lowermost horizontal structure 250a may be thicker than the remaining horizontal structures 250. The lowermost horizontal structure 250a contacting the epitaxial patterns 222 may correspond to the ground selection line GSL of the array of the 3D flash memory described with reference to FIG. 1, and the remaining horizontal structures 250 contacting the vertical structures 230 may correspond to the plurality of word lines WL0 to WL3.

Each of the epitaxial patterns 222 has a recessed sidewall 222a. Accordingly, the lowermost horizontal structure 250a contacting the epitaxial patterns 222 is disposed along a profile of the recessed sidewall 222a. That is, the lowermost horizontal structure 250a may be disposed in an inwardly convex shape along the recessed sidewalls 222a of the epitaxial patterns 222.

In the 3D flash memory of the related art having such a structure, the problem of vertical scaling due to an increase in the number of vertically stacked layers is important. However, from among vertical scaling methods, a method of reducing the thickness of the plurality of electrode layers 245 has a disadvantage in that the characteristics of a memory device itself are affected, and a method of reducing the thickness of the plurality of interlayer insulating layers 211 (a method of reducing spaces between the plurality of electrode layers 245) has a disadvantage in that an interference phenomenon occurs between neighboring cells on the charge storage layer 225.

Accordingly, to overcome the above disadvantages, there is a need for a technology for improving vertical scaling according to an increase in the number of vertically stacked stages.

DESCRIPTION OF EMBODIMENTS

Technical Problem

The present invention provides a 3-dimensional (3D) flash memory and a method of manufacturing the same, which overcome the disadvantages of a vertical scaling method of the related art by applying a structure that mitigates an interference phenomenon between cells (neighboring cells) contacting each other in a plurality of electrode layers in a charge storage layer (oxide-nitride-oxide (ONO) layer) while achieving vertical scaling by reducing spaces between a plurality of electrode layers by a plurality of air gaps between the plurality of electrode layers.

Solution to Problem

According to an aspect of the present invention, there is provided a 3-dimensional (3D) flash memory including at least one channel layer formed to extend in a first direction; a plurality of electrode layers formed to extend in a second direction orthogonal to a first direction so as to be vertically stacked with respect to the at least one channel layer; a plurality of air gaps interposed between the plurality of electrode layers to separate the plurality of electrode layers from each other; and at least one oxide-nitride-oxide (ONO) layer each including a first oxide layer, a nitride layer, and a second oxide layer and formed to extend in the first direction to connect the at least one channel layer and the plurality of electrode layers, wherein the 3D flash memory includes a structure that mitigates an interference phenomenon between cells respectively contacting the plurality of electrode layers in the at least one ONO layer.

The 3D flash memory may include the structure that mitigates the interference phenomenon between the cells respectively contacting the plurality of electrode layers in the at least one ONO layer by etching the first oxide layer and the nitride layer among the at least one ONO layer in a region contacting the plurality of air gaps.

The second oxide layer of the at least one ONO layer may be etched in the region contacting the plurality of air gaps.

The 3D flash memory may include the structure that mitigates the interference phenomenon between the cells respectively contacting the plurality of electrode layers in the at least one ONO layer by forming a blocking material layer on upper and lower portions of each of the plurality of electrode layers.

The 3D flash memory may further include a plurality of electrode protective layers protecting the plurality of electrode layers in a process of generating the plurality of air gaps.

According to another aspect of the present invention, there is provided a method of manufacturing a 3D flash memory including preparing a mold structure in which a plurality of interlayer insulating layers and a plurality of sacrificial layers for electrodes are alternately stacked on a substrate; forming at least one string hole that penetrates the mold structure and exposes the substrate and extending the at least one string hole in a first direction; depositing a first oxide layer, a nitride layer, and a second oxide layer in the at least one string hole and forming and extending at least one oxide-nitride-oxide (ONO) layer including an internal vertical hole in the first direction; forming at least one channel layer in a vertical hole of the at least one ONO layer and extending the at least one channel layer in the first direction; removing the plurality of sacrificial layers for electrodes, forming a plurality of electrode layers in spaces from which the plurality of sacrificial layers for electrodes are removed, and extending the plurality of electrode layers in a second direction orthogonal to the first direction; etching the plurality of interlayer insulating layers to generate a plurality of air gaps interposed between the plurality of electrode layers and separating the plurality of electrode layers from each other; and etching the first oxide layer and the nitride layer of the at least one ONO layer in a region contacting the plurality of air gaps in order to mitigate an interference phenomenon between cells respectively contacting the plurality of electrode layers in the at least one ONO layer.

The etching of the first oxide layer and the nitride layer of the at least one ONO layer in the region contacting the plurality of air gaps may include etching the second oxide layer of the at least one ONO layer in the region contacting the plurality of air gaps.

The mold structure may include a structure in which a plurality of horizontal regions of a plurality of electrode protective layers that protect the plurality of electrode layers are stacked on upper and lower portions of the plurality of sacrificial layers for electrodes during a process of generating the plurality of air gaps.

The forming and extending of the at least one oxide-nitride-oxide (ONO) layer in the first direction may include depositing vertical regions of the plurality of electrode protective layers in the at least one string hole.

The mold structure may include a structure in which a blocking material layer for mitigating the interference phenomenon between the cells respectively contacting the plurality of electrode layers in the at least one ONO layer is stacked on upper and lower portions of each of the plurality of sacrificial layers for electrodes.

According to another aspect of the present invention, there is provided a method of manufacturing a 3D flash memory including preparing a mold structure in which a plurality of interlayer insulating layers and a plurality of sacrificial layers for electrodes are alternately stacked on a substrate—a blocking material layer is stacked upper and lower portions of each of the plurality of sacrificial layers for electrodes in the mold structure; forming at least one string hole that penetrates the mold structure and exposes the substrate and extending the at least one string hole in a first direction;

depositing a first oxide layer, a nitride layer, and a second oxide layer in the at least one string hole and forming and extending at least one oxide-nitride-oxide (ONO) layer including an internal vertical hole in the first direction; forming at least one channel layer in a vertical hole of the at least one ONO layer and extending the at least one channel layer in the first direction; removing the plurality of sacrificial layers for electrodes, forming a plurality of electrode layers in spaces from which the plurality of sacrificial layers for electrodes are removed, and extending the plurality of electrode layers in a second direction orthogonal to the first direction; and etching the plurality of interlayer insulating layers to generate a plurality of air gaps interposed between the plurality of electrode layers and separating the plurality of electrode layers from each other.

According to another aspect of the present invention, there is provided a 3D flash memory including at least one channel layer formed to extend in a first direction; a plurality of electrode layers formed to extend in a second direction orthogonal to a first direction so as to be vertically stacked with respect to the at least one channel layer; a plurality of air gaps interposed between the plurality of electrode layers to separate the plurality of electrode layers from each other; and at least one charge storage layer formed to extend in the first direction to connect the at least one channel layer and the plurality of electrode layers, wherein the 3D flash memory includes a structure that mitigates an interference phenomenon between cells respectively contacting the plurality of electrode layers in the at least one charge storage layer.

The 3D flash memory may include the structure that mitigates the interference phenomenon between the cells respectively contacting the plurality of electrode layers in the at least one charge storage layer by etching the at least one charge storage layer in a region contacting the plurality of air gaps.

The 3D flash memory may include the structure that mitigates the interference phenomenon between the cells respectively contacting the plurality of electrode layers in the at least one charge storage layer by forming a blocking material layer on upper and lower portions of each of the plurality of electrode layers.

According to another aspect of the present invention, there is provided a method of manufacturing a 3D flash memory including preparing a mold structure in which a plurality of interlayer insulating layers and a plurality of sacrificial layers for electrodes are alternately stacked on a substrate; forming at least one string hole that penetrates the mold structure and exposes the substrate and extending the at least one string hole in a first direction; forming at least one charge storage layer including an internal vertical hole in the at least one string hole and extending the at least one charge storage layer in the first direction; forming at least one channel layer in a vertical hole of the at least one charge storage layer and extending the at least one channel layer in the first direction;

removing the plurality of sacrificial layers for electrodes, forming a plurality of electrode layers in spaces from which the plurality of sacrificial layers for electrodes are removed, and extending the plurality of electrode layers in a second direction orthogonal to the first direction; etching the plurality of interlayer insulating layers to generate a plurality of air gaps interposed between the plurality of electrode layers and separating the plurality of electrode layers from each other; and etching the at least one charge storage layer in a region contacting the plurality of air gaps in order to mitigate an interference phenomenon between cells respectively contacting the plurality of electrode layers in the at least one charge storage layer.

The mold structure may include a structure in which a plurality of horizontal regions of a plurality of electrode protective layers that protect the plurality of electrode layers are stacked on upper and lower portions of the plurality of sacrificial layers for electrodes during a process of generating the plurality of air gaps.

The forming and extending of the at least one charge storage layer in the first direction may include depositing vertical regions of the plurality of electrode protective layers in the at least one string hole.

The mold structure may include a structure in which a blocking material layer for mitigating the interference phenomenon between the cells respectively contacting the plurality of electrode layers in the at least one charge storage layer is stacked on upper and lower portions of each of the plurality of sacrificial layers for electrodes.

According to another aspect of the present invention, there is provided a method of manufacturing a 3D flash memory including preparing a mold structure in which a plurality of interlayer insulating layers and a plurality of sacrificial layers for electrodes are alternately stacked on a substrate—a blocking material layer is stacked upper and lower portions of each of the plurality of sacrificial layers for electrodes in the mold structure; forming at least one string hole that penetrates the mold structure and exposes the substrate and extending the at least one string hole in a first direction; forming at least one charge storage layer including an internal vertical hole in the at least one string hole and extending the at least one charge storage layer in the first direction; forming at least one channel layer in a vertical hole of the at least one charge storage layer and extending the at least one channel layer in the first direction; removing the plurality of sacrificial layers for electrodes, forming a plurality of electrode layers in spaces from which the plurality of sacrificial layers for electrodes are removed, and extending the plurality of electrode layers in a second direction orthogonal to the first direction; and etching the plurality of interlayer insulating layers to generate a plurality of air gaps interposed between the plurality of electrode layers and separating the plurality of electrode layers from each other.

Advantageous Effects of Disclosure

The embodiments may provide a 3D flash memory and a method of manufacturing the same, which overcome the disadvantages of a vertical scaling method of the related art by applying a structure that mitigates an interference phenomenon between cells (neighboring cells) contacting each other in a plurality of electrode layers in a charge storage layer (oxide-nitride-oxide (ONO) layer) while achieving vertical scaling by reducing spaces between a plurality of electrode layers by a plurality of air gaps interposed between the plurality of electrode layers.

BRIEF DESCRIPTION OF DRAWINGS

FIGS. 10A to 10G are cross-sectional views illustrating a method of manufacturing a 3D flash memory to which an air gap is applied according to an embodiment.

BEST MODE

Figure 1:
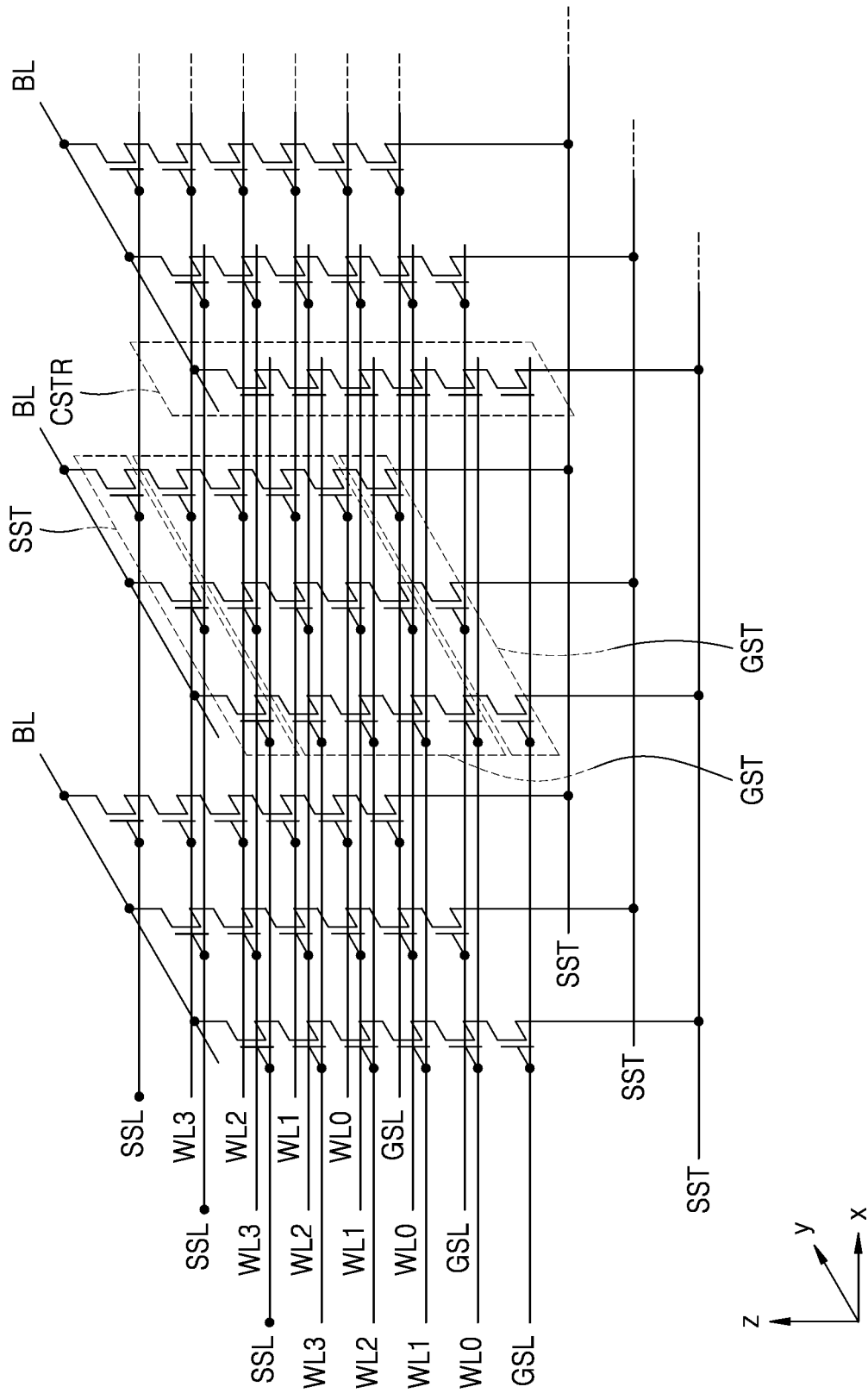
FIG. 1 is a schematic circuit diagram showing an array of a 3D flash memory of the related art.

Hereinafter, embodiments will be described in detail with reference to the accompanying drawings. However, the present invention is not restricted or limited by the embodiments. In addition, the same reference numerals shown in each drawing denotes the same members.

In addition, terminologies used in the present specification are those used to properly express preferred embodiments of the present invention, which may vary depending on users, the intention of operators, or customs in the field to which the present invention belongs. Therefore, definitions of these terminologies should be made based on descriptions throughout the present specification.

Figure 3:
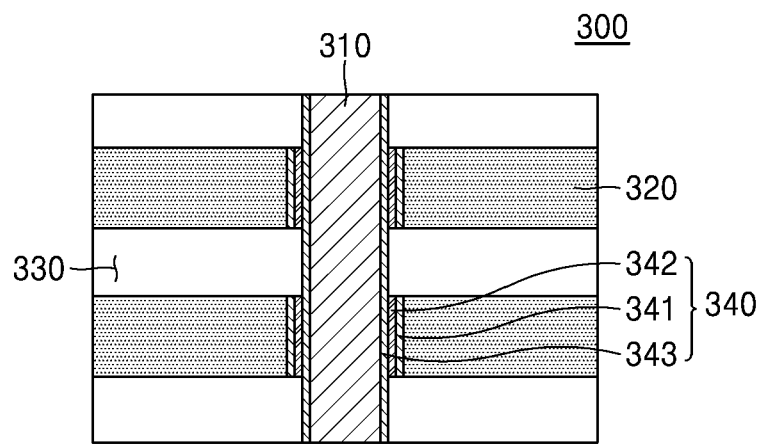
FIG. 3 is a cross-sectional view showing a 3D flash memory to which an air gap is applied according to an embodiment.
Figure 4A:
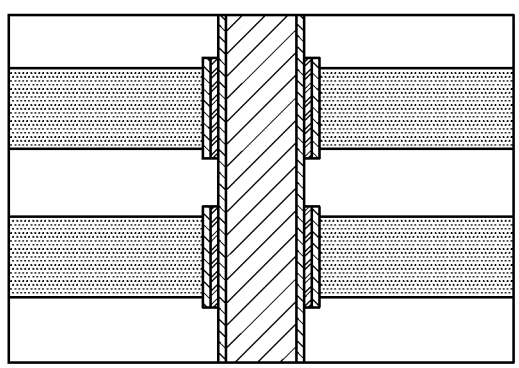
FIGS. 4A to 4B are cross-sectional views showing other embodiments of the 3D flash memory shown in FIG. 3.
Figure 4B:
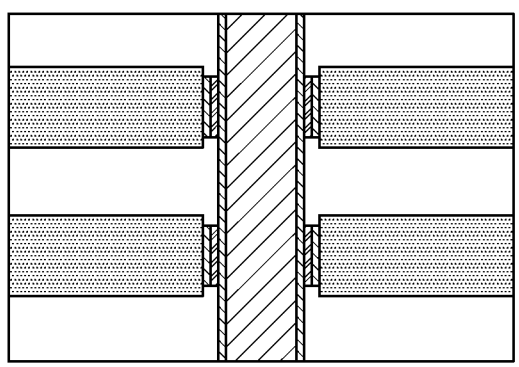

FIG. 3 is a cross-sectional view showing a 3D flash memory to which an air gap is applied according to an embodiment. FIGS. 4A to 4B are cross-sectional views showing other embodiments of the 3D flash memory shown in FIG. 3.

Figure 5:
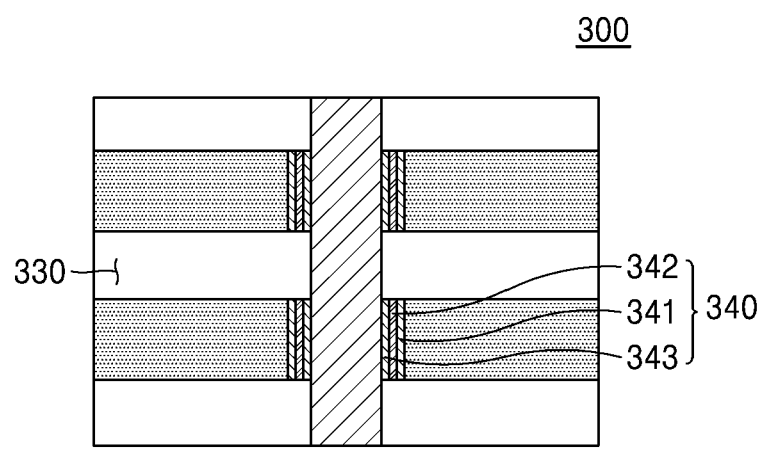
FIG. 5 is a cross-sectional view showing embodiments of a structure in which a second oxide layer is etched in the 3D flash memory shown in FIG. 3.

FIG. 5 is a cross-sectional view showing embodiments of a structure in which a second oxide layer is etched in the 3D flash memory shown in FIG. 3.

Figure 6:
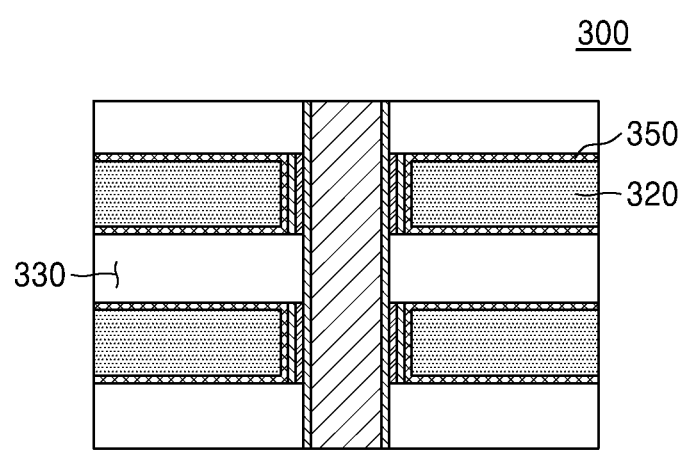
FIG. 6 is a cross-sectional view showing a case in which a plurality of electrode protective layers are further included in the 3D flash memory shown in FIG. 3.

FIG. 6 is a cross-sectional view showing a case in which a plurality of electrode protective layers are further included in the 3D flash memory shown in FIG. 3.

Referring to FIGS. 3 to 6, a 3D flash memory 300 to which an air gap is applied according to an embodiment includes at least one channel layer 310, a plurality of electrode layers 320, a plurality of air gaps 330, and at least one oxide-nitride-oxide (ONO) layer 340.

Figure 2:
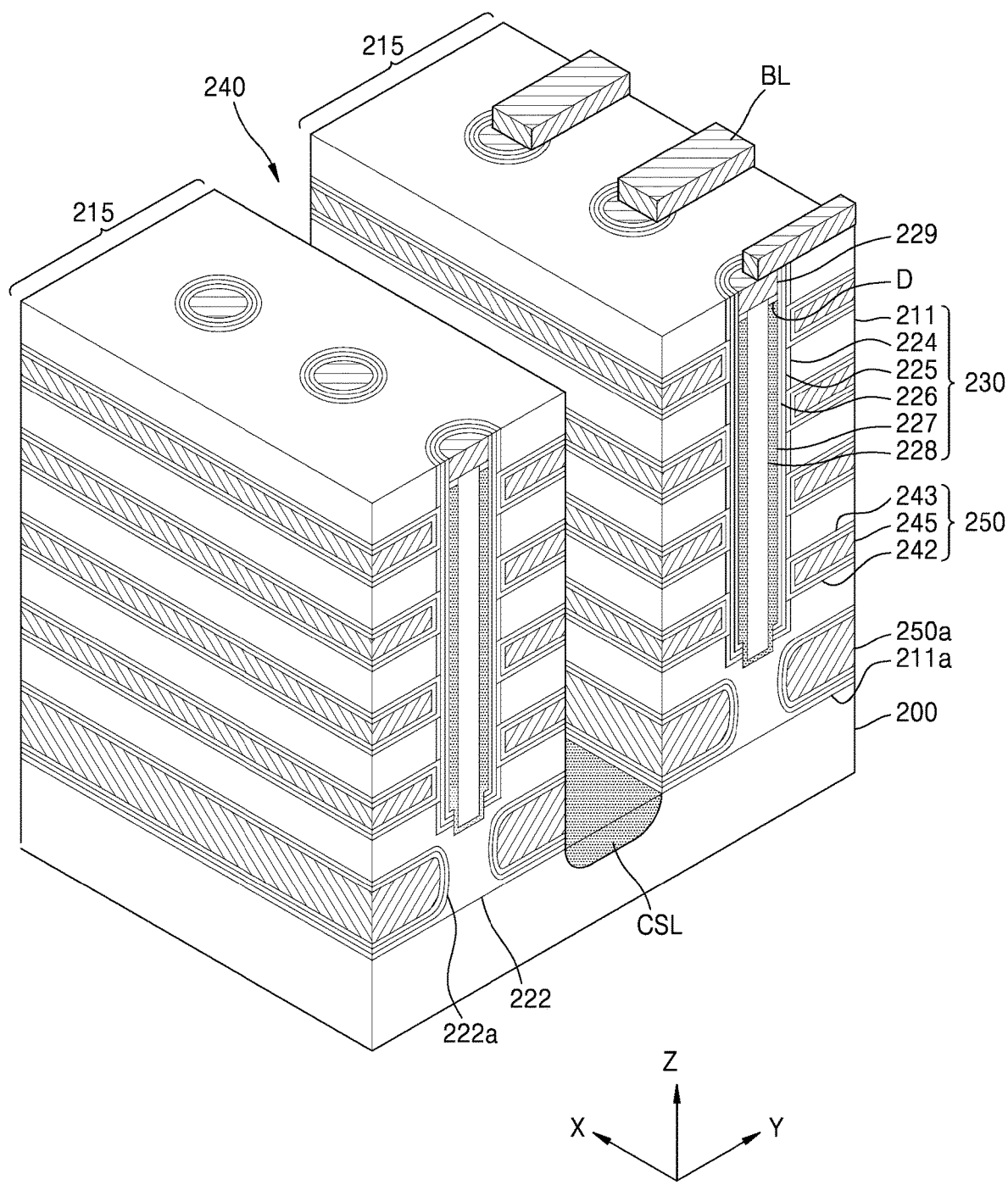
FIG. 2 is a perspective view showing a structure of a 3D flash memory of the related art.

The at least one channel layer 310 may be formed to extend in a first direction (e.g., a z-axis direction in FIG. 2), and monocrystalline silicon may be used as a material.

The plurality of electrode layers 320 may be formed to extend in a second direction (e.g., a y-axis direction in FIG. 2) perpendicular to the first direction so as to be vertically stacked with respect to the at least one channel layer 310, and a conductive material such as tungsten, titanium, and tantalum may be used as a material.

The plurality of air gaps 330 are components interposed between the plurality of electrode layers 320 to separate the plurality of electrode layers 320 from each other. A stand (not shown) preventing short between the plurality of electrode layers 320 as necessary may pass through the plurality of air gaps 330 and be connected to the plurality of electrode layers 320.

The at least one ONO layer 340 may be formed to extend in the first direction (e.g., the z-axis direction in FIG. 2) to connect the plurality of air gaps 330 and the at least one channel layer 310 and the plurality of electrode layers 320, and may include a first oxide layer (tunnel oxide layer) 341, a nitride layer (charge trap layer) 342 and a second oxide layer (interior oxide layer) 343.

Here, since the plurality of air gaps 330 are formed to have a thinner thickness than interlayer insulating layers included in the 3D flash memory of the related art, spaces between the plurality of electrode layers 320 in the 3D flash memory 300 according to an embodiment may be smaller than spaces between plurality of electrode layers in the 3D flash memory of the related art. Accordingly, the 3D flash memory 300 according to an embodiment may have an improved degree of integration compared to the 3D flash memory of the related art.

In particular, a structure that mitigates an interference phenomenon between cells respectively contacting the plurality of electrode layers 320 in the at least one ONO layer 340 is applied to the 3D flash memory 300 according to an embodiment, and thus a disadvantage in that the interference phenomenon occurs between neighboring cells on the at least one ONO layer 340 may be overcome.

In more detail, the structure that mitigates the interference phenomenon between cells respectively contacting the plurality of electrode layers 320 in the at least one ONO layer 340 may be applied by etching the first oxide layer 341 and the nitride layer 342 among the at least one ONO layer 340 in a region contacting the plurality of air gaps 330. That is, among the first oxide layer 341, the nitride layer 342, and the second oxide layer 343 constituting the at least one ONO layer 340, the first oxide layer 341 and the nitride layer 342 may be present only in a region that contacts each of the plurality of electrode layers 320 and may have a structure in which the first oxide layer 341 and the nitride layer 342 are isolated between upper and lower neighboring cells.

As such, the structure in which the first oxide layer 341 and the nitride layer 342 among the at least one ONO layer 340 are etched in the region contacting the plurality of air gaps 330 is not restricted or limited to that illustrated in FIG. 3. Instead, as shown in FIGS. 4A to 4B, the first oxide layer 341 and the nitride layer 342 may be variously implemented in a structure in which the first oxide layer 341 and the nitride layer 342 are isolated between upper and lower neighboring cells.

In addition, the 3D flash memory 300 according to an embodiment is not restricted or limited to having the structure in which the first oxide layer 341 and the nitride layer 342 are etched in a region contacting the plurality of air gaps 330 to be isolated between upper and lower neighboring cells, and may have a structure in which the second oxide layer 343 is etched as shown in FIG. 5.

In addition, the 3D flash memory 300 may further include a plurality of electrode protective layers 350 protecting the plurality of electrode layers 320 in a process of generating the plurality of air gaps 330 as shown in FIG. 6. The plurality of electrode protective layers 350 may include a material (e.g., oxynitride) having an etch ratio different from a process of etching a plurality of interlayer insulating layers and a process of removing sacrificial layers for a plurality of electrodes among operations of a method of manufacturing the 3D flash memory to be described later. However, the present invention is not restricted or limited thereto, and the plurality of electrode protective layers 350 may include a material (e.g., nitride) having the same etch ratio as that of the process of removing the sacrificial layers for the plurality of electrodes while may be formed at a thickness that may partially remain during the process of removing the sacrificial layers for the plurality of electrodes.

As described above, although it is described that the structure that mitigates the interference phenomenon between cells respectively contacting the plurality of electrode layers 320 is applied to the 3D flash memory 300 by etching the first oxide layer 341 and the nitride layer 342 among the at least one ONO layer 340 in the region contacting the plurality of air gaps 330, a structure that mitigates the interference phenomenon between cells respectively contacting the plurality of electrode layers 320 in the at least one ONO layer 340 may be applied to the 3D flash memory 300 by using a blocking material layer. A detailed description in this regard will be given with reference to FIG. 7.

In addition, although the 3D flash memory 300 is described above when the at least one ONO layer 340 is used as the charge storage layer, when a charge storage layer other than the at least one ONO layer 340 is used, a 3D flash memory according to an embodiment may include at least one channel layer formed to extend in a first direction; a plurality of electrode layers formed to extend in a second direction orthogonal to the first direction so as to be vertically stacked with respect to the at least one channel layer; a plurality of air gaps interposed between the plurality of electrode layers to separate the plurality of electrode layers from each other; and at least one charge storage layer formed to extend in the first direction so as to connect the at least one channel layer and the plurality of electrode layers, and similar to those described with reference to FIGS. 3 to 6, may have a structure that mitigates the interference phenomenon between cells respectively contacting the plurality of electrode layers in the at least one charge storage layer by etching the at least one charge storage layer in a region contacting the plurality of air gaps.

Figure 7:
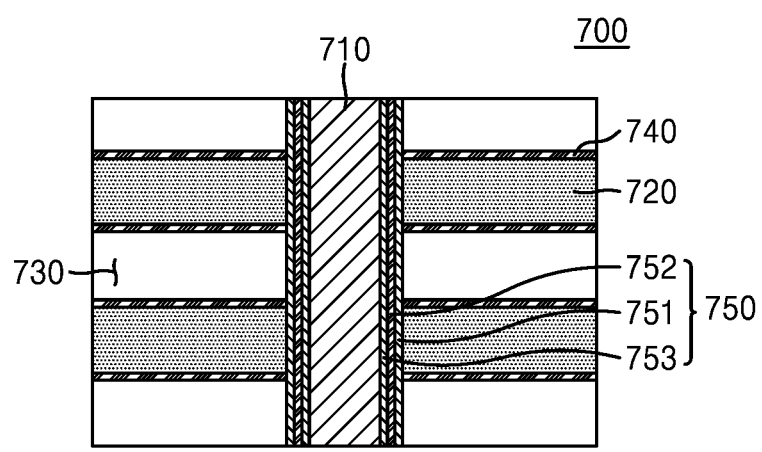
FIG. 7 is a cross-sectional view illustrating a 3D flash memory to which a blocking material layer is applied according to an embodiment.
Figure 8:
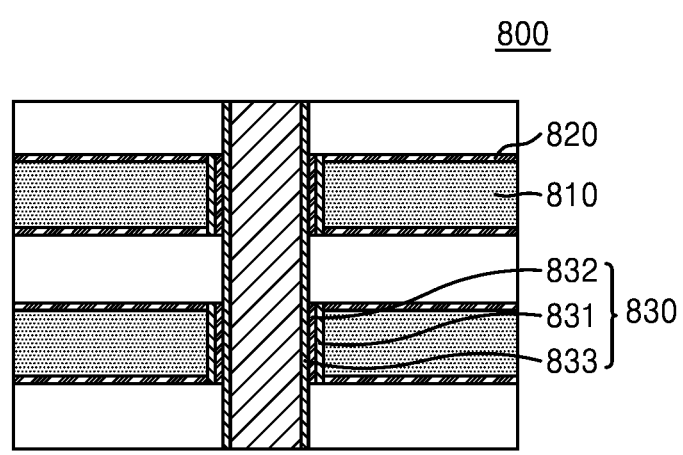
FIG. 8 is a cross-sectional view illustrating a 3D flash memory to which both an air gap and a blocking material layer are applied according to an embodiment.

FIG. 7 is a cross-sectional view illustrating a 3D flash memory to which a blocking material layer is applied according to an embodiment, and FIG. 8 is a cross-sectional view illustrating a 3D flash memory to which both an air gap and a blocking material layer are applied according to an embodiment.

Referring to FIG. 7, a 3D flash memory 700 to which the blocking material layer is applied according to an embodiment includes at least one channel layer 710, a plurality of electrode layers 720, a plurality of air gaps 730, a blocking material layer 740 and at least one ONO layer 750.

The at least one channel layer 710 is formed to extend in a first direction (e.g., a z-axis direction in FIG. 2), and monocrystalline silicon may be used as a material.

The plurality of electrode layers 720 may be formed to extend in a second direction (e.g., a y-axis direction in FIG. 2) perpendicular to the first direction so as to be vertically stacked with respect to the at least one channel layer 710, and a conductive material such as tungsten, titanium, and tantalum may be used as a material.

The plurality of air gaps 730 are components interposed between the plurality of electrode layers 720 to separate the plurality of electrode layers 720 from each other. A stand (not shown) preventing short between the plurality of electrode layers 720 as necessary may pass through the plurality of air gaps 330 and be connected to the plurality of electrode layers 720.

The at least one ONO layer 750 may be formed to extend in the first direction (e.g., the z-axis direction in FIG. 2) to connect the plurality of air gaps 730 and the at least one channel layer 710 and the plurality of electrode layers 720, and may include a first oxide layer (tunnel oxide layer) 751, a nitride layer (charge trap layer) 752 and a second oxide layer (interior oxide layer) 753.

Here, since the plurality of air gaps 730 are formed to have a thinner thickness than interlayer insulating layers included in the 3D flash memory of the related art, spaces between the plurality of electrode layers 720 in the 3D flash memory 700 according to an embodiment may be smaller than spaces between plurality of electrode layers in the 3D flash memory of the related art. Accordingly, the 3D flash memory 700 according to an embodiment may have an improved degree of integration compared to the 3D flash memory of the related art.

In particular, a structure that mitigates an interference phenomenon between cells respectively contacting the plurality of electrode layers 720 in the at least one ONO layer 750 is applied to the 3D flash memory 700 according to an embodiment, and thus a disadvantage in that the interference phenomenon occurs between neighboring cells on the at least one ONO layer 750 may be overcome.

In more detail, the structure that mitigates the interference phenomenon between cells respectively contacting the plurality of electrode layers 720 in the at least one ONO layer 750 may be applied through the blocking material layer 740 formed on the upper and lower portions of each of the plurality of electrode layers 720. That is, the blocking material layer 740 formed on upper and lower portions of each of the plurality of electrode layers 720 isolates regions respectively contacting the plurality of electrode layers 720 in the at least one ONO layer 750, and thus the structure that mitigates the interference phenomenon between cells respectively contacting the plurality of electrode layers 720 in the at least one ONO layer 750 may be applied. As the blocking material layer 740, any material having an electrically non-conducting property may be used. For example, silicon nitride, silicon oxynitride, silicon oxide, or metal oxide may be used.

In addition, the 3D flash memory 700 may further include a plurality of electrode protective layers (not shown) to protect the plurality of electrode layers 720 in a process of generating the plurality of air gaps 730. Positions and materials of the plurality of electrode protective layers (not shown) are the same as those described above with reference to FIG. 6, and thus detailed descriptions thereof are omitted.

As described above, although it is described that the blocking material layer 740 formed on the upper and lower portions of each of the plurality of electrode layers 720 isolates regions respectively contacting the plurality of electrode layers 720 in the at least one ONO layer 750, and thus the structure that mitigates the interference phenomenon between cells respectively contacting the plurality of electrode layers 720 in the at least one ONO layer 750 may be applied to the 3D flash memory 700, additionally, as described above with reference to FIG. 3, the structure that mitigates the interference phenomenon between cells respectively contacting the plurality of electrode layers 720 in the at least one ONO layer 750 may be applied to the 3D flash memory 700 by etching the first oxide layer 751 and the nitride layer 752 among the at least one ONO layer 750 in a region contacting the plurality of air gaps 730. In this case, as shown in FIG. 8, a 3D flash memory 800 may have a structure in which a blocking material layer 820 is formed on upper and lower portions of each of the plurality of electrode layers 810, and simultaneously, a first oxide layer 831 and a nitride layer 832 among at least one ONO layer 830 are etched in a region contacting a plurality of air gaps 840.

In addition, although the 3D flash memory 700 is described above when the at least one ONO layer 750 is used as a charge storage layer, when the charge storage layer other than the at least one ONO layer 750 is used, a 3D flash memory according to an embodiment may include at least one channel layer formed to extend in a first direction; a plurality of electrode layers formed to extend in a second direction orthogonal to the first direction so as to be vertically stacked with respect to the at least one channel layer; a plurality of air gaps interposed between the plurality of electrode layers to separate the plurality of electrode layers from each other; and at least one charge storage layer formed to extend in the first direction so as to connect the at least one channel layer and the plurality of electrode layers, and similar to those described with reference to FIG. 7, may have a structure that mitigates the interference phenomenon between cells respectively contacting the plurality of electrode layers in the at least one charge storage layer by forming the blocking material layer on upper and lower portions of each of the plurality of electrode layers.

Figure 9:
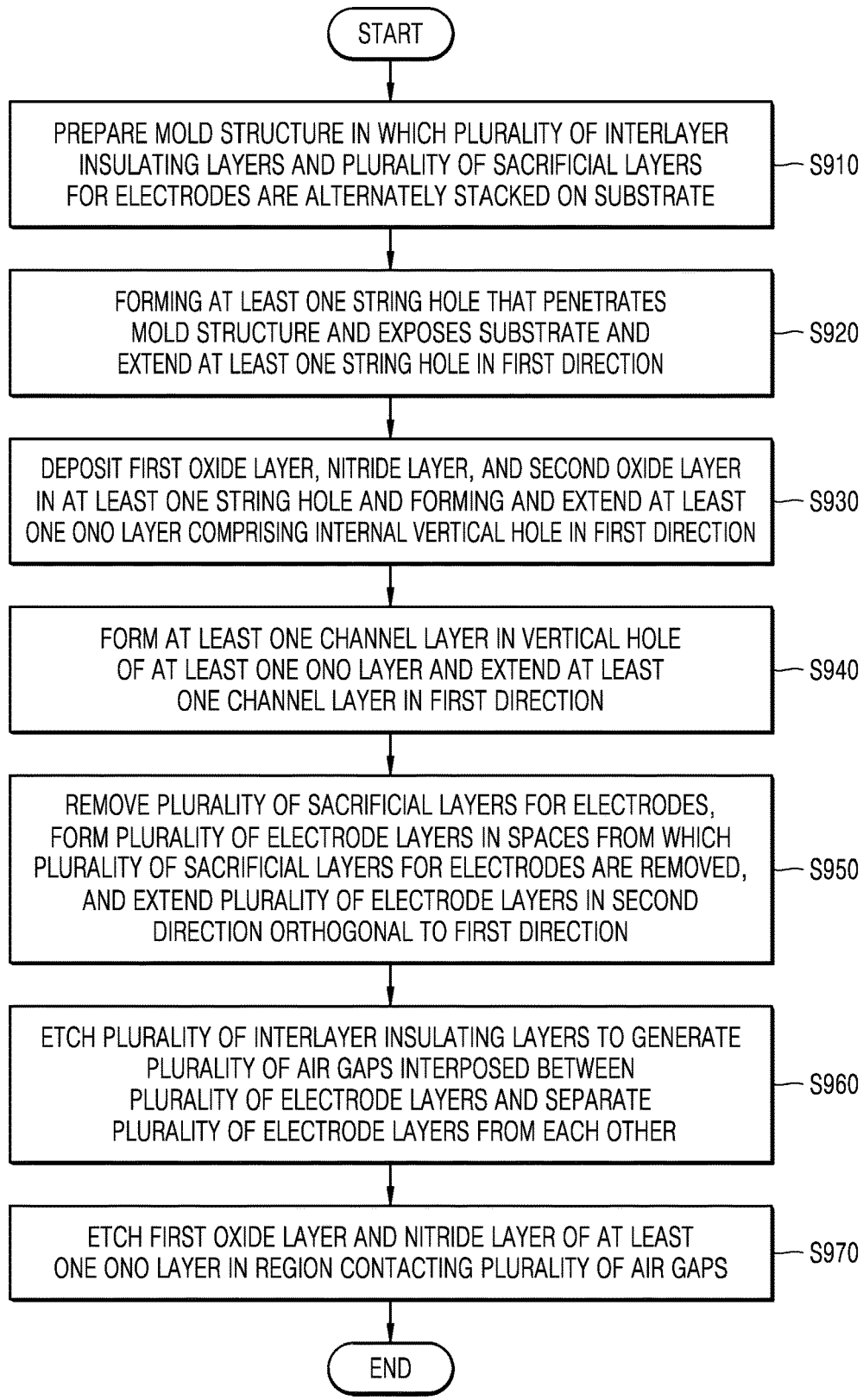
FIG. 9 is a flowchart illustrating a method of manufacturing a 3D flash memory to which an air gap is applied according to an embodiment.

FIG. 9 is a flowchart illustrating a method of manufacturing a 3D flash memory to which an air gap is applied according to an embodiment, and FIGS. 10A to 10G are cross-sectional views illustrating a method of manufacturing a 3D flash memory to which an air gap is applied according to an embodiment.

Hereinafter, the 3D flash memory manufactured by the method of manufacturing the 3D flash memory has the structure described above with reference to FIG. 3. In addition, hereinafter, an automated and mechanized manufacturing system may be used as a subject performing the manufacturing method of the 3D flash memory.

Figure 10C:
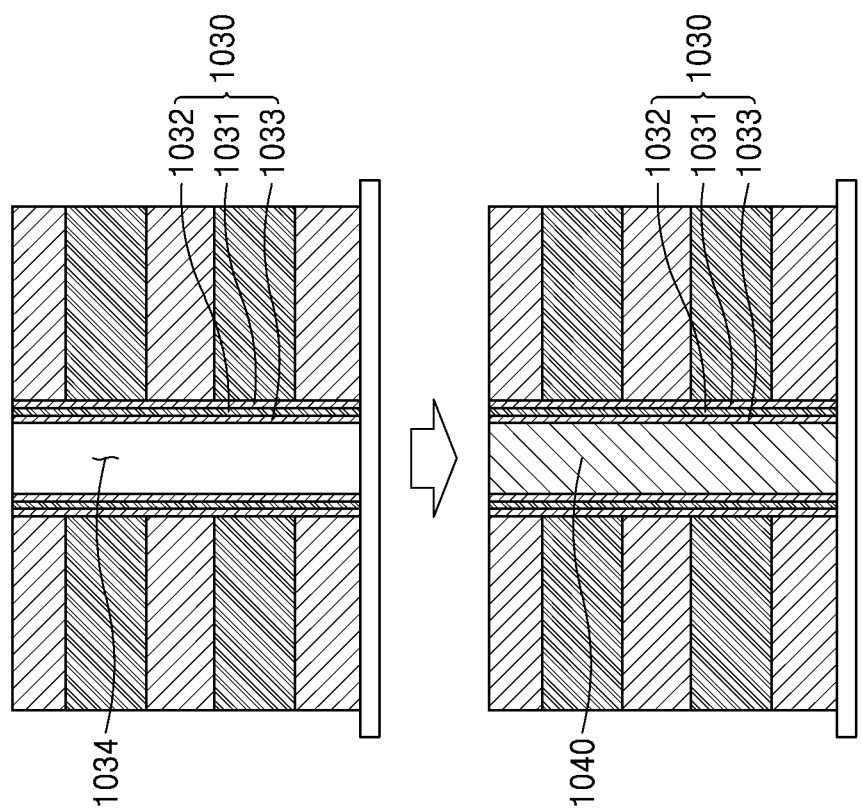
Figure 10D:
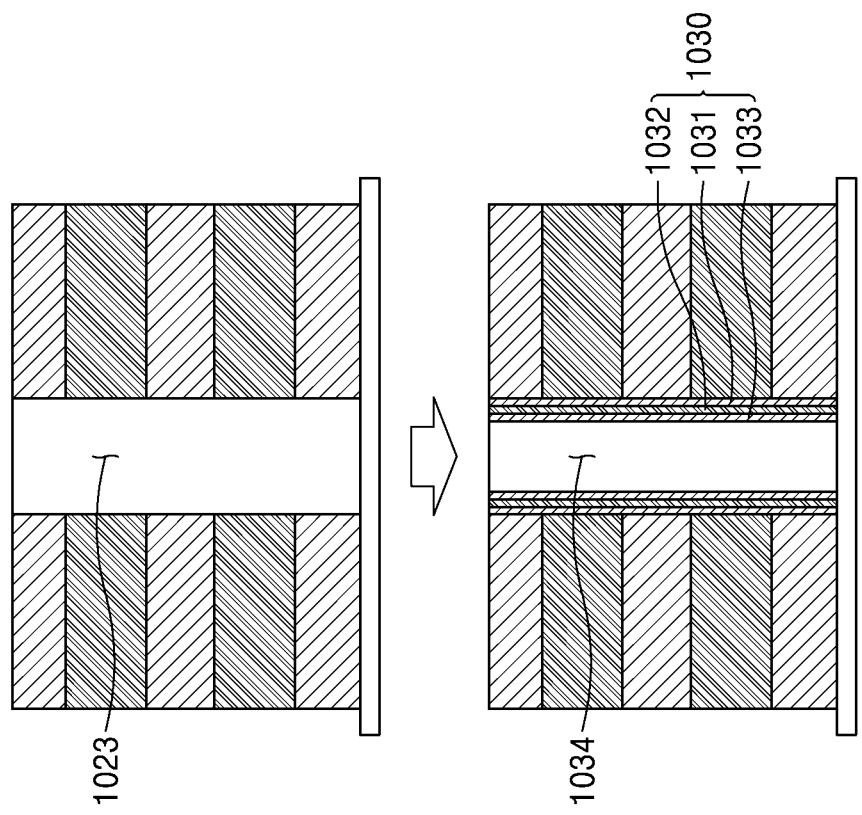
Figure 10E:
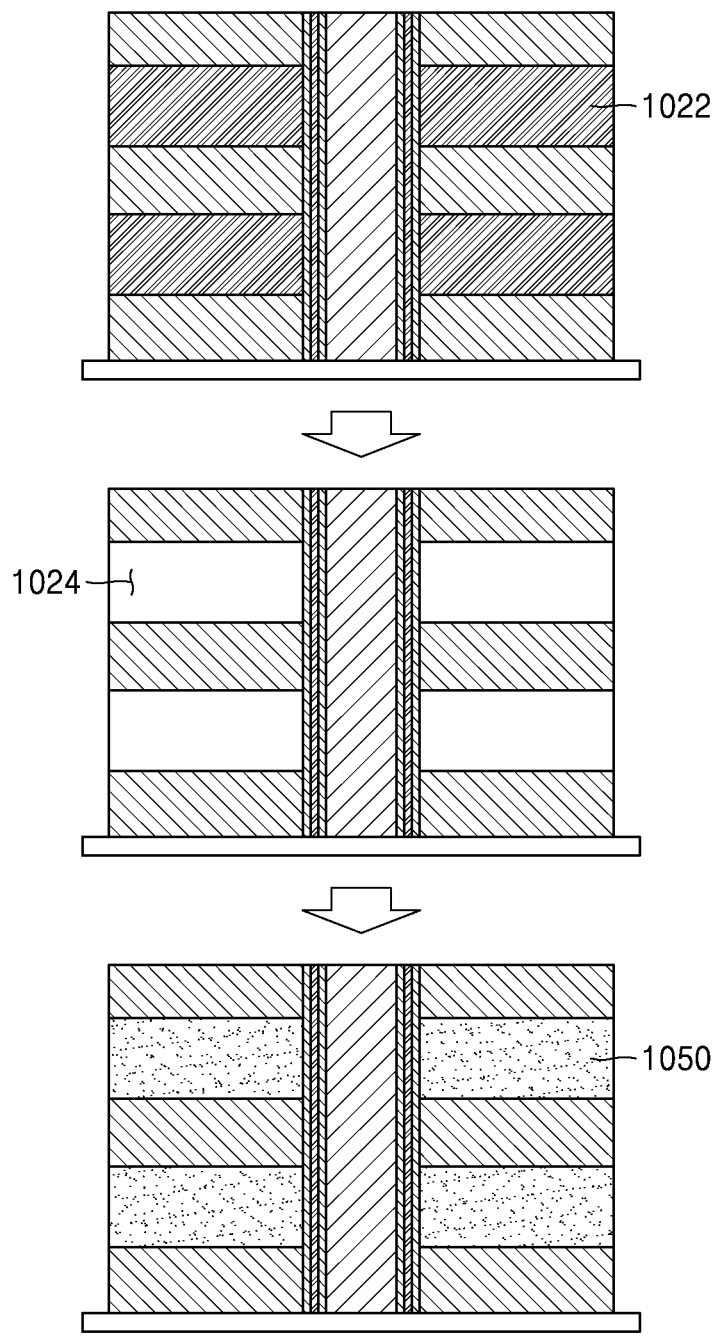
Figure 10G:
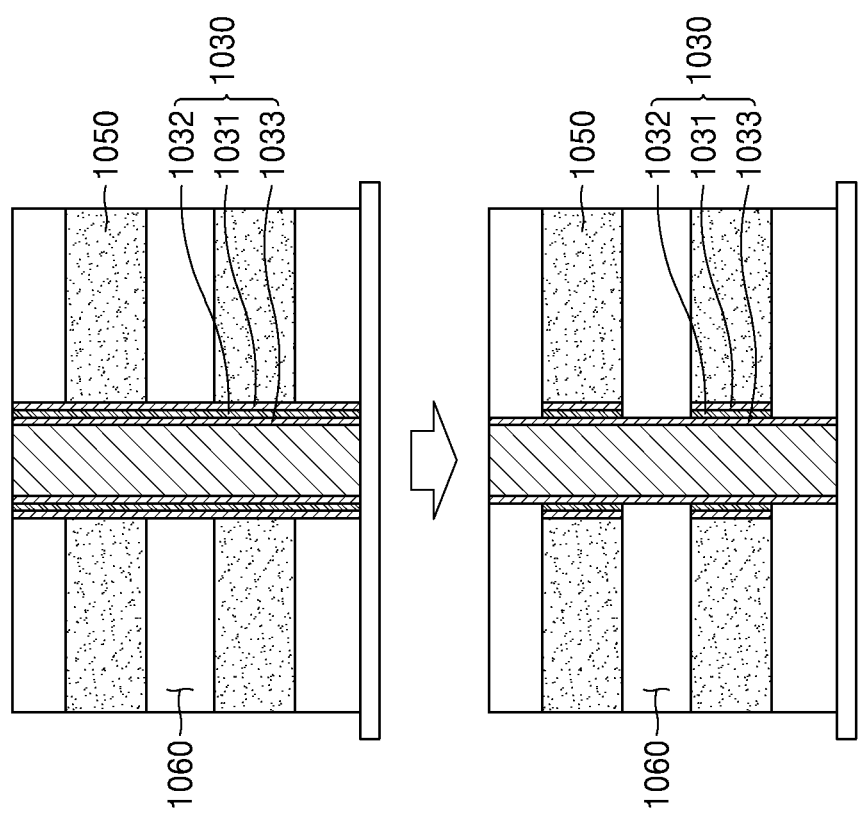

Referring to FIGS. 9 to 10G, a manufacturing system according to an embodiment prepares a mold structure 1020 in which a plurality of interlayer insulating layers 1021 and a plurality of sacrificial layers 1022 for electrodes are alternately stacked on a substrate 1010 as shown in FIG. 10A is prepared in operation S910. Here, the plurality of interlayer insulating layers 1021 may include oxide, and the plurality of sacrificial layers 1022 for electrodes may include nitride.

Subsequently, in operation S920, the manufacturing system forms and extends at least one string hole 1023 passing through the mold structure 1020 to expose the substrate 1010 in a first direction as shown in FIG. 10B.

Then, in operation S930, the manufacturing system deposits a first oxide layer 1031, a nitride layer 1032, and a second oxide layer 1033 in the at least one string hole 1023 as shown in FIG. 10C to form and extend at least one ONO layer 1030 including an internal vertical hole 1034 in the first direction.

Next, in operation S940, the manufacturing system forms and extends at least one channel layer 1040 in the vertical hole 1034 of the at least one ONO layer 1030 in the first direction as shown in FIG. 10D. In this regard, the at least one channel layer 1040 may include monocrystalline silicon.

Next, in operation S950, the manufacturing system removes the plurality of sacrificial layers 1022 for electrodes and forms and extends a plurality of electrode layers 1050 in spaces 1024 from which the plurality of sacrificial layers 1022 for electrodes are removed in a second direction orthogonal to the first direction as shown in FIG. 10E. Here, as a method of removing the plurality of sacrificial layers 1022 for electrodes, various chemical and physical etching methods may be used, and the plurality of electrode layers 1050 may include a conductive material such as tungsten, titanium, tantalum, etc.

Figure 10F:
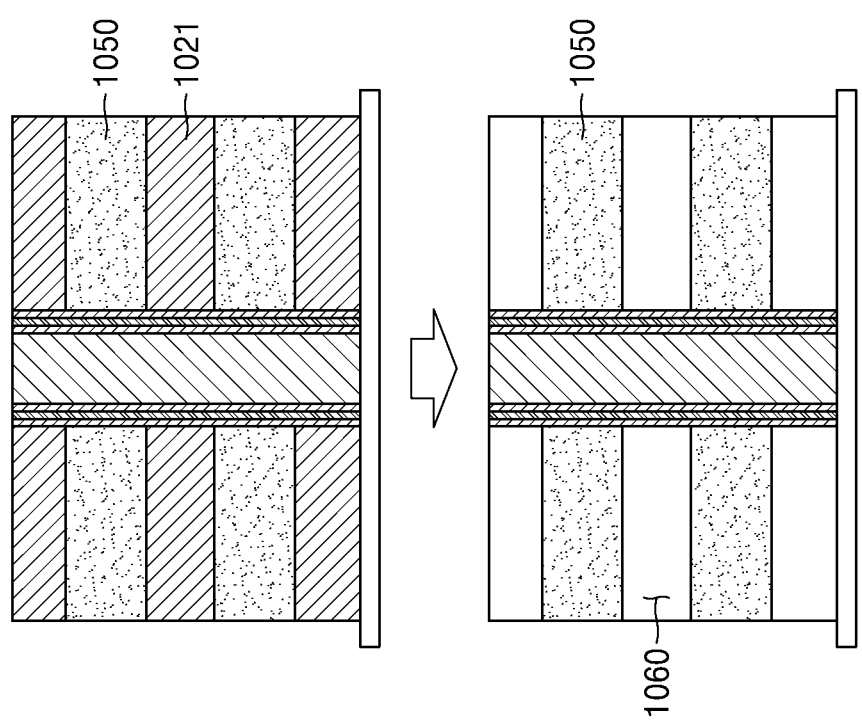

Next, in operation S960, the manufacturing system etches the plurality of interlayer insulating layers 1021 to generate a plurality of air gaps 1060 interposed between the plurality of electrode layers 1050 and separating the plurality of electrode layers 1050 from each other as shown in FIG. 10F. In this regard, various chemical etching methods and physical etching methods may be used as a method of etching the plurality of interlayer insulating layers 1021.

Thereafter, in operation S970, in order to mitigate the interference phenomenon between the cells contacting the plurality of electrode layers 1050 in the at least one ONO layer 1030, the manufacturing system etches the first oxide layer 1031 and the nitride layer 1032 of the at least one ONO layer 1030 in a region that contacts the plurality of air gaps 1060 as shown in FIG. 10G. Through operation S970, among the first oxide layer 1031, the nitride layer 1032, and the second oxide layer 1033 constituting the at least one ONO layer 1030, the first oxide layer 1031 and the nitride layer 1032 may be present only in a region that contacts each of the plurality of electrode layers 1050, and may have a structure in which upper and lower neighboring cells are isolated from each other.

Accordingly, the 3D flash memory manufactured through the operations S910 to S970 may have the structure described above with reference to FIGS. 3 to 4.

In addition, in operation S970, the manufacturing system may etch the second oxide layer 1033 of the at least one ONO layer 1030 in the region that contacts the plurality of air gaps 1060. In this case, the 3D flash memory having the structure described above with reference to FIG. 5 may be manufactured.

As described above, the 3D flash memory manufactured through the above-described operations (S910 to S970) includes the plurality of air gaps 1060 that are formed to have a thickness thinner than that of interlayer insulating layers included in the 3D flash memory of the related art, thereby having an improved degree of integration compared to the 3D flash memory of the related art, and the structure that mitigates the interference phenomenon between cells respectively contacting the plurality of electrode layers 1050 in the at least one ONO layer 1030 may be applied to the 3D flash memory by etching the first oxide layer 1031 and the nitride layer 1032 among the at least one ONO layer 1030 in the region contacting the plurality of air gaps 1060, thereby overcoming a disadvantage in that the interference phenomenon occurs between neighboring cells on the at least one ONO layer 1030.

In addition, the manufacturing system may prepare the mold structure 1020 having a structure in which a plurality of horizontal regions of a plurality of electrode protective layers (e.g., 350 as illustrated in FIG. 6) that protect the plurality of electrode layers 1050 are stacked on upper and lower portions of the plurality of sacrificial layers 1022 for electrodes during the process of generating the plurality of air gaps 1060 in operation S910 and deposit vertical regions of the plurality of electrode protective layers 1070 (e.g., 350 as illustrated in FIG. 6) in the at least one string hole 1023 before forming the at least one ONO layer 1030 in operation S930, thereby manufacturing the 3D flash memory including the plurality of electrode protective layers (e.g., 350 as illustrated in FIG. 6) described above with reference to FIG. 6. In this case, a region of the vertical regions of the plurality of electrode protection layers (e.g., 350 as illustrated in FIG. 6) contacting the plurality of air gaps 1060 may be removed during a process of etching the plurality of interlayer insulating layers 1021 in operation S950 or during a process of etching the first oxide layer 1031 and the nitride layer 1032 of the at least one ONO layer 1030 in the region contacting the plurality of air gaps 1060 in operation S970.

In addition, the manufacturing system may use the mold structure 1020 having a structure in which a blocking material layer (not shown) for mitigating the interference phenomenon between cells respectively contacting the plurality of electrode layers 1050 in the at least one ONO layer 1030 is stacked on the upper and lower portions of each of the plurality of sacrificial layers 1022 for electrodes in operation S910, thereby manufacturing the 3D flash memory described above with reference to FIG. 8.

Although the method of manufacturing the 3D flash memory when the at least one ONO layer 1030 is used as a charge storage layer is described above, when a charge storage layer other than the at least one ONO layer 1030 is used, the method of manufacturing the 3D flash memory according to an embodiment is as follows.

1. A mold structure in which a plurality of interlayer insulating layers and a plurality of sacrificial layers for electrodes are alternately stacked on a substrate is prepared.

2. At least one string hole that penetrates the mold structure and exposes the substrate is formed to extend in a first direction.

3. At least one charge storage layer including an internal vertical hole is formed to extend in the at least one string hole in the first direction.

4. At least one channel layer is formed to extend in the vertical hole of the at least one charge storage layer in the first direction.

5. The plurality of sacrificial layers for electrodes are removed and a plurality of electrode layers are formed to extend in a second direction orthogonal to the first direction in spaces from which the plurality of sacrificial layers for electrodes are removed.

6. A plurality of interlayer insulating layers are etched to generate a plurality of air gaps interposed between the plurality of electrode layers and separating the plurality of electrode layers from each other.

7. The at least one charge storage layer is etched in a region contacting the plurality of air gaps in order to mitigate an interference phenomenon between cells respectively contacting the plurality of electrode layers in the at least one charge storage layer.

Each process of such a manufacturing method is similar or the same as each of the operations described above with reference to FIGS. 9 to 10G, and thus a detailed description thereof is omitted.

Figure 11:
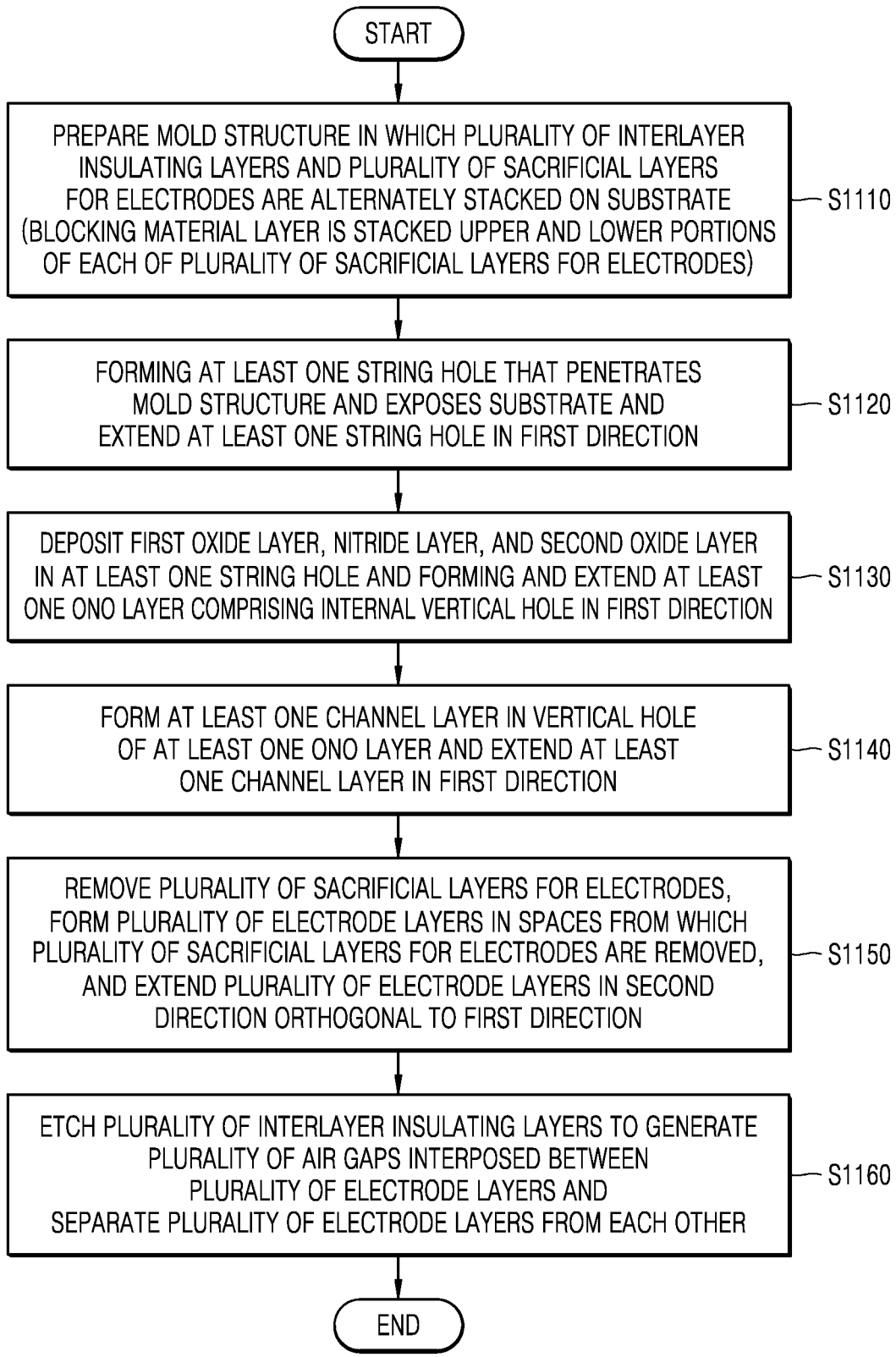
FIG. 11 is a flowchart illustrating a method of manufacturing a 3D flash memory to which a blocking material layer is applied according to an embodiment.

FIG. 11 is a flowchart illustrating a method of manufacturing a 3D flash memory to which a blocking material layer is applied according to an embodiment, and FIGS. 12A to 12F are cross-sectional views illustrating a method of manufacturing a 3D flash memory to which a blocking material layer is applied according to an embodiment.

Hereinafter, the 3D flash memory manufactured by the method of manufacturing the 3D flash memory has the structure described above with reference to FIG. 7. In addition, hereinafter, an automated and mechanized manufacturing system may be used as a subject performing the manufacturing method of the 3D flash memory.

Figure 12B:
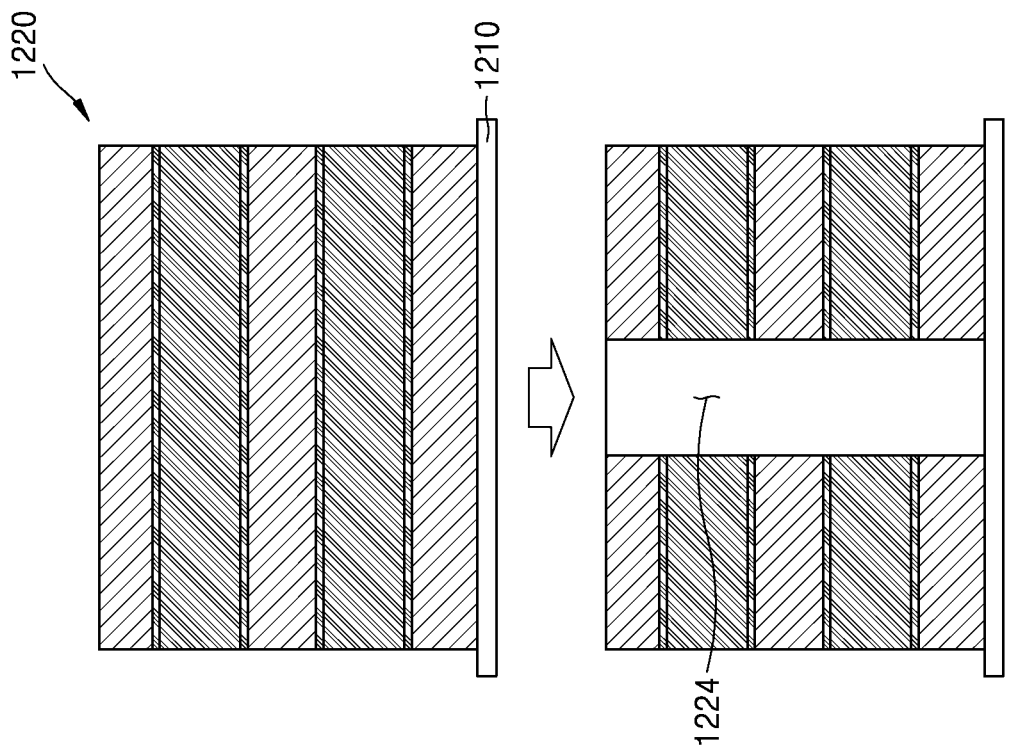
FIGS. 12A to 12F are cross-sectional views illustrating a method of manufacturing a 3D flash memory to which a blocking material layer is applied according to an embodiment.
Figure 12A:
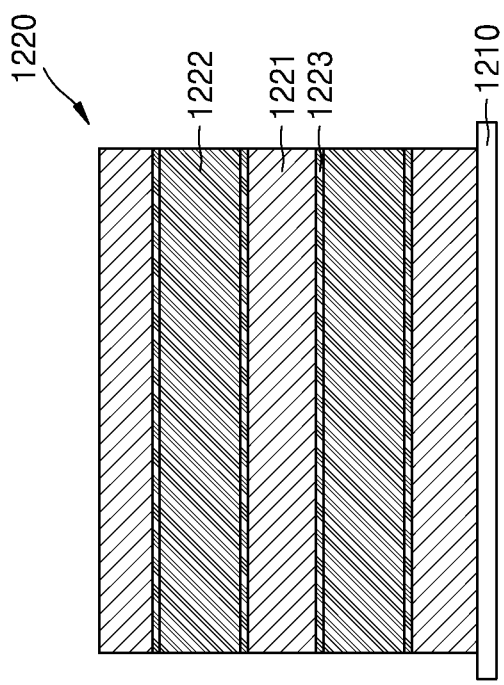
Figure 12C:
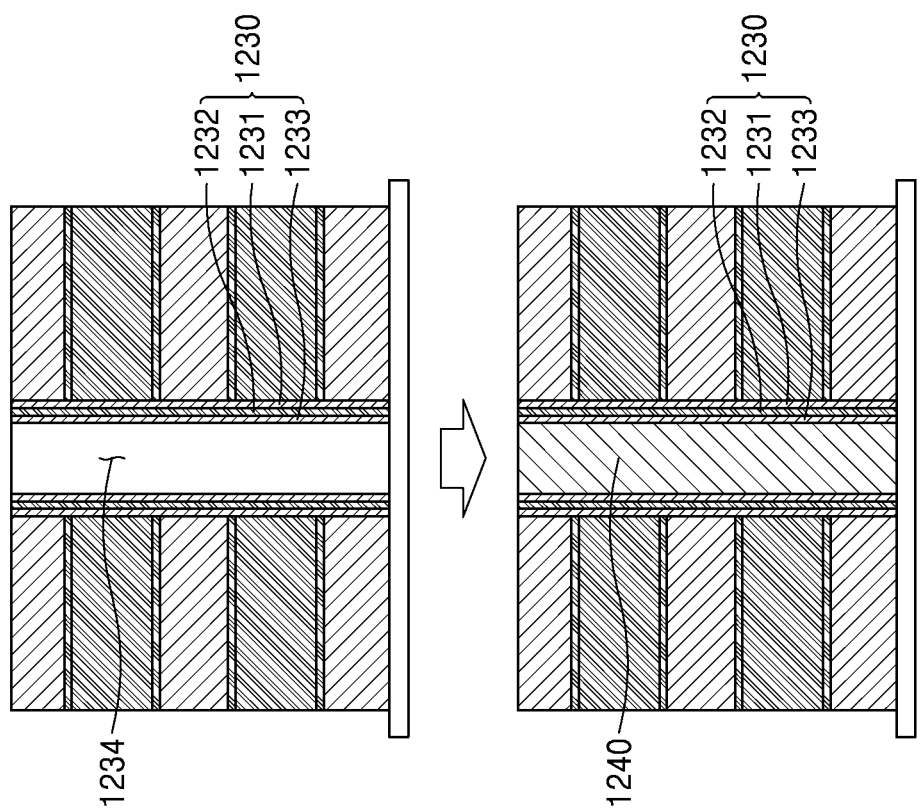
Figure 12D:
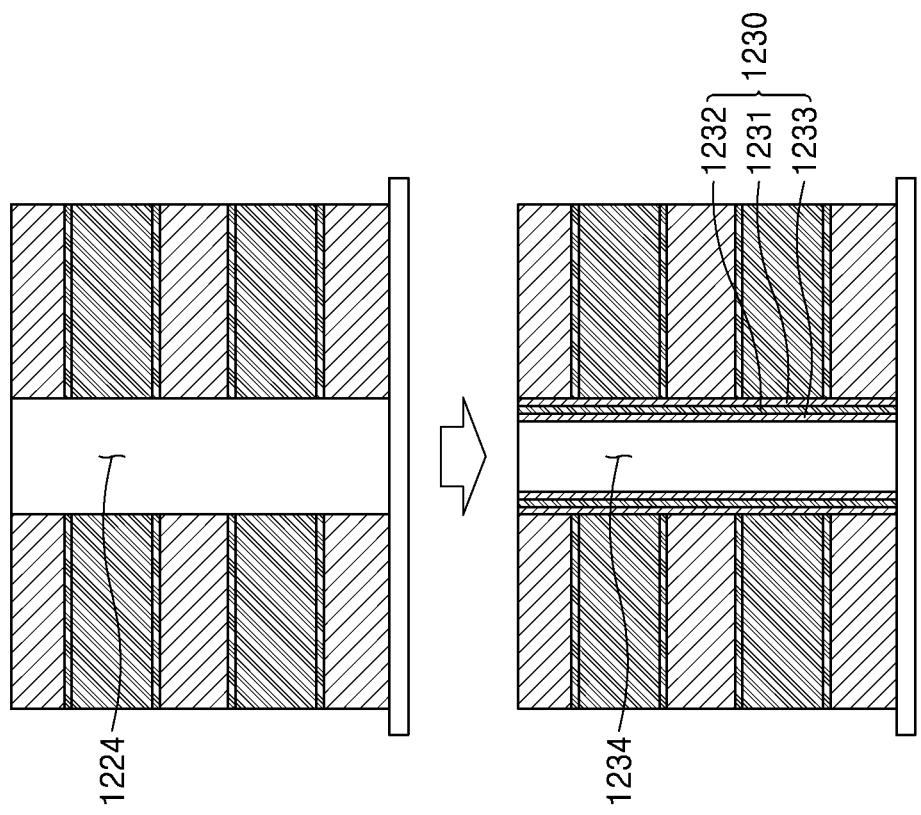
Figure 12E:
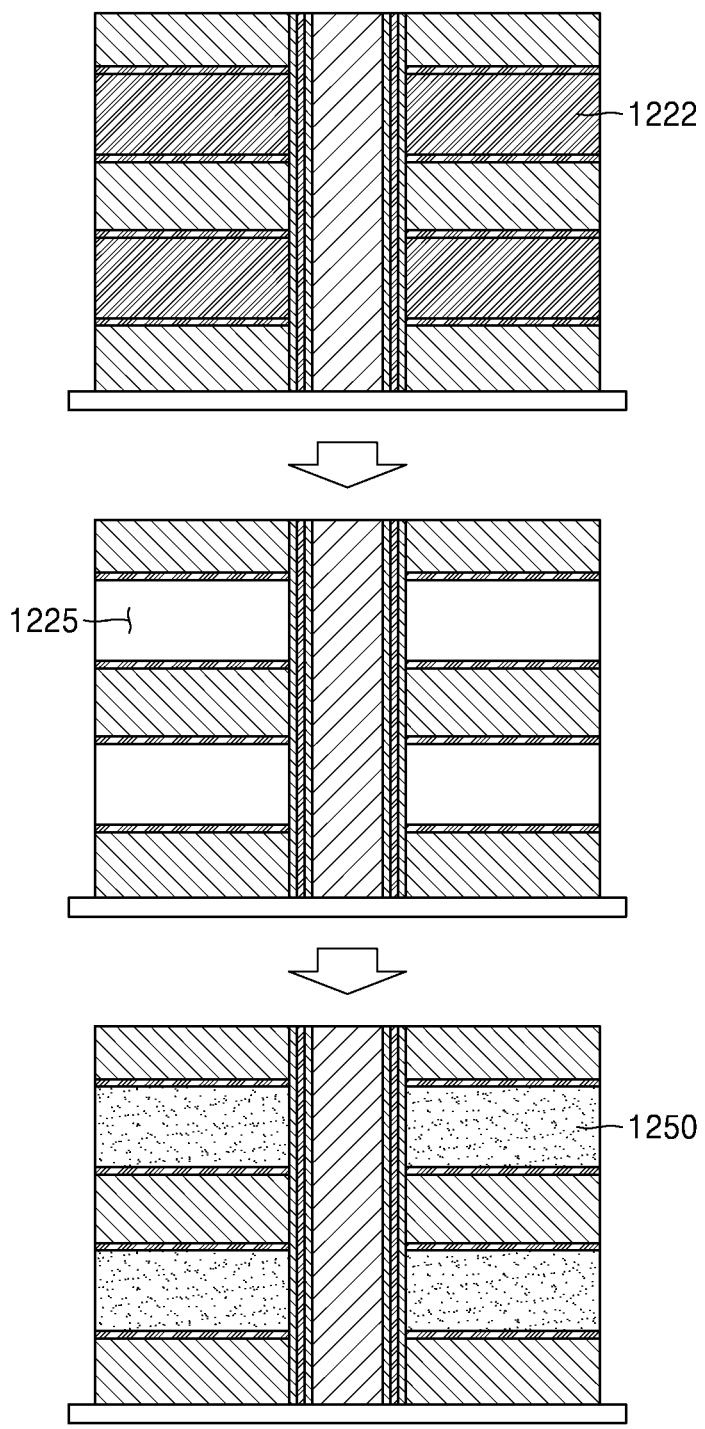
Figure 12F:
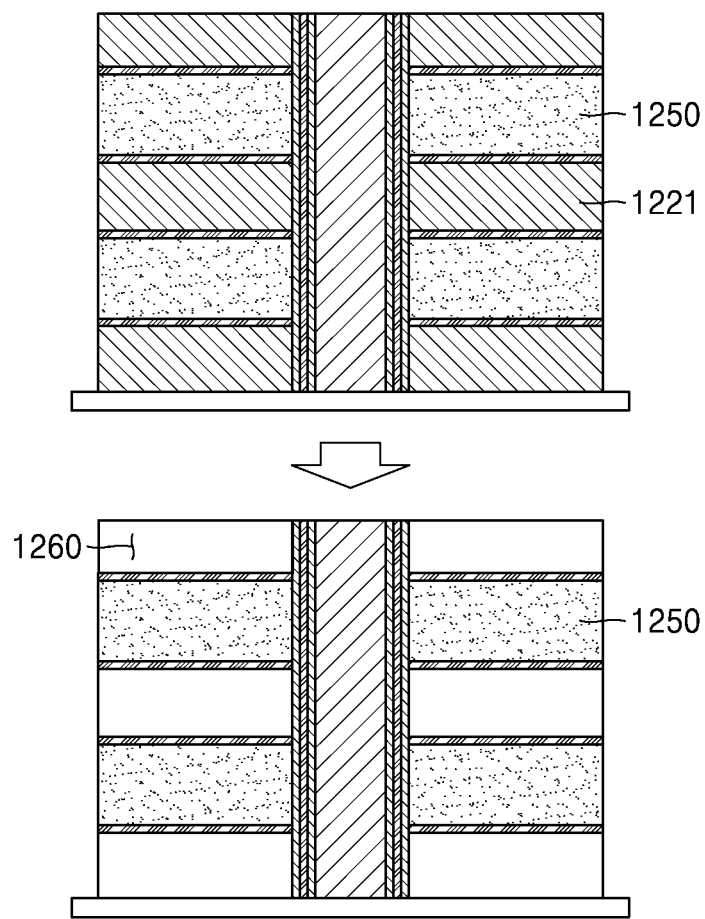

Referring to FIGS. 11 to 12F, a manufacturing system according to an embodiment prepares a mold structure 1220 in which a plurality of interlayer insulating layers 1221 and a plurality of sacrificial layers 1222 for electrodes are alternately stacked on a substrate 1010 as shown in FIG. 12A is prepared in operation S1110. Here, the plurality of interlayer insulating layers 1221 may include oxide, and the plurality of sacrificial layers 1222 for electrodes may include nitride. In particular, in the mold structure 1220, a blocking material layer 1223 is stacked on upper and lower portions of each of the plurality of sacrificial layers 1222 for electrodes.

Subsequently, in operation S1120, the manufacturing system forms and extends at least one string hole 1224 passing through the mold structure 1220 to expose the substrate 1210 in a first direction as shown in FIG. 12B.

Then, in operation S1130, the manufacturing system deposits a first oxide layer 1231, a nitride layer 1232, and a second oxide layer 1233 in the at least one string hole 1224 as shown in FIG. 12C to form and extend at least one ONO layer 1230 including an internal vertical hole 1234 in the first direction.

Next, in operation S1140, the manufacturing system forms and extends at least one channel layer 1240 in the vertical hole 1234 of the at least one ONO layer 1230 in the first direction as shown in FIG. 12D. In this case, the at least one channel layer 1240 may include monocrystalline silicon.

Next, in operation S1150, the manufacturing system removes the plurality of sacrificial layers 1222 for electrodes and forms and extends a plurality of electrode layers 1250 in spaces 1224 from which the plurality of sacrificial layers 1222 for electrodes are removed in a second direction orthogonal to the first direction as shown in FIG. 12E. Here, as a method of removing the plurality of sacrificial layers 1222 for electrodes, various chemical and physical etching methods may be used, and the plurality of electrode layers 1250 may include a conductive material such as tungsten, titanium, tantalum, etc.

Next, in operation S1160, the manufacturing system etches the plurality of interlayer insulating layers 1221 to generate a plurality of air gaps 1260 interposed between the plurality of electrode layers 1250 and separating the plurality of electrode layers 1250 from each other as shown in FIG. 12F. In this regard, various chemical etching methods and physical etching methods may be used as a method of etching the plurality of interlayer insulating layers 1221.

Accordingly, the 3D flash memory manufactured through the operations S1110 to S1160 may have the structure described above with reference to FIG. 7.

As described above, the 3D flash memory manufactured through the above-described operations (S1110 to S1170) includes the plurality of air gaps 1260 that are formed to have a thickness thinner than that of interlayer insulating layers included in the 3D flash memory of the related art, thereby having an improved degree of integration compared to the 3D flash memory of the related art, and a structure in which regions respectively contacting the plurality of electrode layers 1250 are isolated from each other in the at least one ONO layer 1230 by the blocking material layer 1223 stacked on upper and lower portions of each of the plurality of electrode layers 1250 may be applied to the 3D flash memory, thereby overcoming a disadvantage in that the interference phenomenon occurs between neighboring cells on the at least one ONO layer 1230.

In addition, the manufacturing system may prepare the mold structure 1220 having a structure in which a plurality of horizontal regions of a plurality of electrode protective layers (e.g., 350 as illustrated in FIG. 6) that protect the plurality of electrode layers 1250 are stacked on upper and lower portions of the plurality of sacrificial layers 1222 for electrodes during the process of generating the plurality of air gaps 1260 in operation S1110 and deposit vertical regions of the plurality of electrode protective layers (e.g., 350 as illustrated in FIG. 6) in the at least one string hole 1223 before forming the at least one ONO layer 1230 in operation S1130, thereby manufacturing the 3D flash memory including the plurality of electrode protective layers (e.g., 350 as illustrated in FIG. 6) described above with reference to FIG. 6.

In this case, a region of the vertical regions of the plurality of electrode protection layers (e.g., 350 as illustrated in FIG. 6) contacting the plurality of air gaps 1260 may be removed during a process of etching the plurality of interlayer insulating layers 1221 in operation S1150.

Although the method of manufacturing the 3D flash memory when the at least one ONO layer 1230 is used as a charge storage layer is described above, when a charge storage layer other than the at least one ONO layer 1230 is used, the method of manufacturing the 3D flash memory according to an embodiment is as follows.

1. A mold structure in which a plurality of interlayer insulating layers and a plurality of sacrificial layers for electrodes are alternately stacked on a substrate is prepared. In particular, a blocking material layer is stacked on upper and lower portions of each of the plurality of sacrificial layers for electrodes in the mold structure.

2. At least one string hole that penetrates the mold structure and exposes the substrate is formed to extend in a first direction.

3. At least one charge storage layer including an internal vertical hole is formed to extend in the at least one string hole in the first direction.

4. At least one channel layer is formed to extend in the vertical hole of the at least one charge storage layer in the first direction.

5. The plurality of sacrificial layers for electrodes are removed and a plurality of electrode layers are formed to extend in a second direction orthogonal to the first direction in spaces from which the plurality of sacrificial layers for electrodes are removed.

6. A plurality of interlayer insulating layers are etched to generate a plurality of air gaps interposed between the plurality of electrode layers and separating the plurality of electrode layers from each other.

Each process of such a manufacturing method is similar or the same as each of the operations described above with reference to FIGS. 11 to 12F, and thus a detailed description thereof is omitted.

As described above, although the embodiments have been described by the limited embodiments and drawings, various modifications and variations are possible from the above description to those of ordinary skill in the art. For example, even if the described technologies are performed in an order different from the described method, and/or components such as the described system, structure, device, circuit, etc. are coupled or combined in a form different from the described method, or are replaced or substituted by other components or equivalents, an appropriate result may be achieved.

Therefore, other implementations, other embodiments, and those equivalent to the claims also fall within the scope of the claims to be described below.

The invention claimed is:

1. A 3-dimensional (3D) flash memory comprising:
   at least one channel layer formed to extend in a first direction;
   a plurality of electrode layers formed to extend in a second direction orthogonal to a first direction so as to be vertically stacked with respect to the at least one channel layer;
   a plurality of air gaps between the plurality of electrode layers to separate the plurality of electrode layers from each other;
   at least one oxide-nitride-oxide (ONO) layer comprising a first oxide layer, a nitride layer, and a second oxide layer and formed to extend in the first direction to connect the at least one channel layer and the plurality of electrode layers; and
   a blocking material layer formed on an upper portion and a lower portion of each of the plurality of electrode layers,
   wherein the first oxide layer, the nitride layer, and the second oxide layer extend continuously in the first direction between the at least one channel layer and each of the plurality of electrode layers and the plurality of air gaps, and
   wherein the first oxide layer contacts the plurality of air gaps, the blocking material layer, and the plurality of electrode layers.

2. A method of manufacturing a 3-dimensional (3D) flash memory, the method comprising:
   preparing a mold structure in which a plurality of interlayer insulating layers and a plurality of sacrificial layers for electrodes are alternately stacked on a substrate;
   forming at least one string hole that penetrates the mold structure and exposes the substrate and extending the at least one string hole in a first direction;
   depositing a first oxide layer, a nitride layer, and a second oxide layer in the at least one string hole and forming and extending at least one oxide-nitride-oxide (ONO) layer comprising an internal vertical hole in the first direction;
   forming at least one channel layer in a vertical hole of the at least one ONO layer and extending the at least one channel layer in the first direction;
   removing the plurality of sacrificial layers for electrodes, forming a plurality of electrode layers in spaces from which the plurality of sacrificial layers for electrodes are removed, and extending the plurality of electrode layers in a second direction orthogonal to the first direction;
   etching the plurality of interlayer insulating layers to generate a plurality of air gaps between the plurality of electrode layers and separating the plurality of electrode layers from each other; and
   forming a blocking material layer on an upper portion and a lower portion of each of the plurality of electrode layers; and
   wherein the first oxide layer, the nitride layer, and the second oxide layer extend continuously in the first direction between the at least one channel layer and each of the plurality of electrode layers and the plurality of air gaps, and wherein the first oxide layer contacts the plurality of air gaps, the blocking material layer, and the plurality of electrode layers.

* * * * *